United States Patent
Creasman et al.

(10) Patent No.: US 9,606,882 B2
(45) Date of Patent: Mar. 28, 2017

(54) METHODS AND SYSTEMS FOR DIE FAILURE TESTING

(71) Applicant: SanDisk Enterprise IP LLC, Milpitas, CA (US)

(72) Inventors: Scott Creasman, Gilbert, AZ (US); James M. Higgins, Chandler, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 143 days.

(21) Appl. No.: 14/596,177

(22) Filed: Jan. 13, 2015

(65) Prior Publication Data
US 2016/0019127 A1    Jan. 21, 2016

Related U.S. Application Data

(60) Provisional application No. 62/025,841, filed on Jul. 17, 2014.

(51) Int. Cl.
*G06F 11/00* (2006.01)
*G06F 11/20* (2006.01)
*G11C 29/02* (2006.01)

(52) U.S. Cl.
CPC .......... *G06F 11/2094* (2013.01); *G11C 29/02* (2013.01); *G11C 29/028* (2013.01); *G06F 2201/805* (2013.01); *G06F 2201/85* (2013.01)

(58) Field of Classification Search
CPC ............. G06F 11/3672; G06F 11/2221; G06F 11/2094

(Continued)

(56) References Cited

U.S. PATENT DOCUMENTS 5,254,482 A    10/1993  Fisch
6,148,354 A *  11/2000  Ban ...................... G06F 3/0607
                                                710/301

(Continued)

FOREIGN PATENT DOCUMENTS

EP    1139414    10/2001

OTHER PUBLICATIONS

International Search Report and Written Opinion dated Nov. 2, 2015, received in International Application No. PCT/US2015/033909, which corresponds to U.S. Appl. No. 14/311,143, 18 pages (Frayer).

(Continued)

*Primary Examiner* — Dieu-Minh Le
(74) *Attorney, Agent, or Firm* — Morgan, Lewis & Bockius LLP

(57) ABSTRACT

The disclosed method includes, at a storage controller of a storage system, receiving host instructions to modify configuration settings corresponding to a first memory portion of a plurality of memory portions. The method includes, in response to receiving the host instructions to modify the configuration settings, identifying the first memory portion from the host instructions and modifying the configuration settings corresponding to the first memory portion, in accordance with the host instructions. The method includes, after modifying the configuration settings corresponding to the first memory portion, sending one or more commands to perform memory operations having one or more physical addresses corresponding to the first memory portion and receiving a failure notification indicating failed performance of at least a first memory operation of the one or more memory operations. The method includes, in response to receiving the failure notification, executing one or more error recovery mechanisms.

24 Claims, 6 Drawing Sheets

(58) Field of Classification Search
USPC .............................. 714/41, 40, 39, 1, 2, 47.1
See application file for complete search history.

(56) References Cited

U.S. PATENT DOCUMENTS

| | | | | |
|---|---|---|---|---|
| 7,949,931 | B2* | 5/2011 | Lastras-Montano | G06F 11/1044 714/768 |
| 8,291,295 | B2* | 10/2012 | Harari | G06F 11/1068 365/185.09 |
| 8,443,263 | B2* | 5/2013 | Selinger | G06F 11/1068 714/768 |
| 8,707,104 | B1* | 4/2014 | Jean | G06F 11/1048 714/41 |
| 8,976,609 | B1 | 3/2015 | Frayer et al. | |
| 2003/0076125 | A1 | 4/2003 | McCord | |
| 2003/0115564 | A1 | 6/2003 | Chang et al. | |
| 2005/0047229 | A1 | 3/2005 | Nadeau-Dostie et al. | |
| 2006/0168488 | A1 | 7/2006 | Hill et al. | |
| 2006/0179378 | A1 | 8/2006 | Iida et al. | |
| 2007/0263449 | A1 | 11/2007 | Yu et al. | |
| 2008/0046802 | A1* | 2/2008 | Honda | G06F 11/1044 714/805 |
| 2010/0141286 | A1 | 6/2010 | Varadarajan et al. | |
| 2010/0296353 | A1 | 11/2010 | Hong et al. | |
| 2014/0029355 | A1 | 1/2014 | Choi et al. | |

OTHER PUBLICATIONS

International Search Report and Written Opinion dated Oct. 2, 2015, received in International Application No. PCT/US2015/039789, which corresponds to U.S. Appl. No. 14/596,177, 12 pages (Creasman).

* cited by examiner

METHODS AND SYSTEMS FOR DIE FAILURE TESTING

RELATED APPLICATIONS

This application claims priority to U.S. Provisional Patent Application No. 62/025,841, filed Jul. 17, 2014, which is hereby incorporated by reference in its entirety.

TECHNICAL FIELD

The disclosed embodiments relate generally to memory systems, and in particular, to enabling testing of error recovery mechanisms through simulation of memory operation failures.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

Typical methods for validating die failures or plane failures for memory devices involve either manipulating the hardware to induce hardware failures or examining hardware that has already failed, to determine how the failure occurred. These methods have their drawbacks, because hardware manipulated failures do not accurately represent actual die failures and a failed die may exhibit a different failure mode at the time of observation, than at the time of its original failure.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to simulate memory operation failures on one or more portions of memory, allowing for the testing of error recovery mechanisms on the one or more memory portions.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1A:
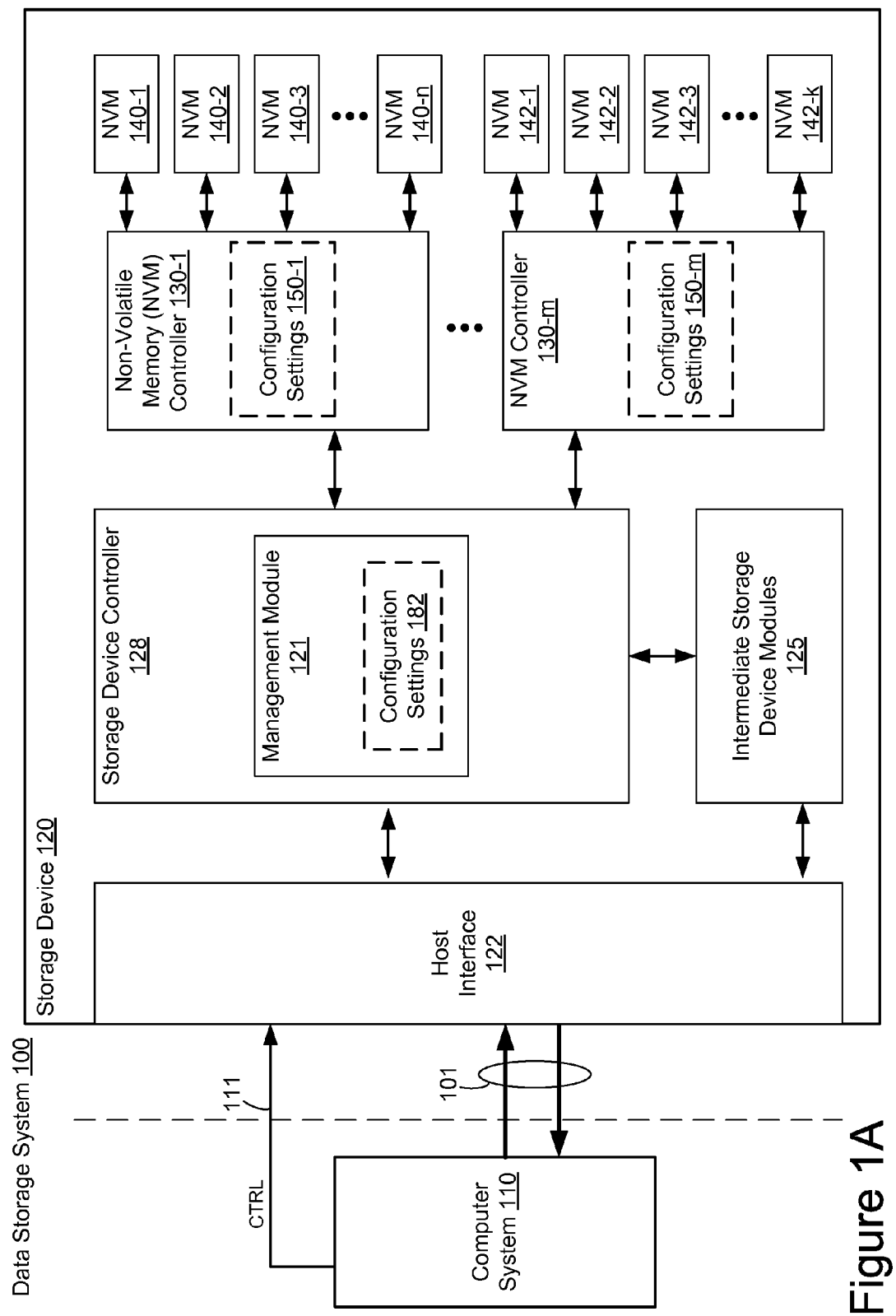
FIG. 1A is a block diagram illustrating a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to observe and evaluate various error recovery mechanisms used on failed memory devices. Some implementations include systems, methods and/or devices to enable memory operation failure testing.

The memory storage needs for electronic devices ranging from smart phones to server systems are rapidly growing. For example, as enterprise applications mature, the capacity of storage devices required for these applications has dramatically increased. As the capacity has increased, correspondingly, the number of non-volatile memory chips inside the storage devices has also increased. As a result of the number of memory chips increasing, there is a need for effective testing of error recovery mechanisms to ensure that the fastest and most reliable mechanisms are implemented in these real-world applications.

In order to effectively test various error recovery mechanisms, some implementations are described herein to realistically simulate memory operation failures on respective portions of non-volatile memory. For example, write failures to a particular die of a memory device are simulated, to test how one or more error recovery mechanisms attempt to remedy or compensate for that observed error.

More specifically, in some embodiments, a method is performed in a storage device that comprises a storage controller and one or more memory devices, each with a plurality of memory portions. The method includes receiving host instructions from a host system to modify configuration settings corresponding to a first memory portion of the plurality of memory portions. The method includes, in response to receiving the host instructions to modify the configuration settings, identifying the first memory portion from the host instructions and modifying the configuration settings corresponding to the first memory portion, in accordance with the host instructions. The method further includes, after said modifying the configuration settings corresponding to the first memory portion, sending one or more commands to perform one or more memory operations having one or more physical addresses corresponding to the first memory portion. The method further includes receiving a failure notification indicating failed performance of at least a first memory operation of the one or more memory operations, and in response to receiving the failure notification, executing one or more error recovery mechanisms.

In some embodiments, the method further includes, in response to receiving the failure notification, after executing the one or more error recovery mechanisms, monitoring performance of the one or more error recovery mechanisms and reporting, to the host system, the performance of the one or more error recovery mechanisms.

In some embodiments, the first memory portion of the plurality of memory portions is a first die. In some embodiments, failed performance of the first memory operation of the one or more memory operations comprises successful completion of the first memory operation with failure to satisfy one or more predefined performance criteria. In some embodiments, the host instructions comprise a physical address of the first memory portion and a mode setting corresponding to a mode of simulated failed performance of memory operations at the first memory portion, wherein the memory operations are selected from the group consisting of read operations, write operations and erase operations.

In some embodiments, the method further includes, in response to detecting the mode setting, simulating failure of the first memory portion to perform one or more memory operations selected from the group consisting of read operations, write operations and erase operations, the simulating including generating the failure notification.

In some embodiments, modifying the configuration settings corresponding to the first memory portion in accordance with the host instructions includes adjusting a read threshold voltage for the first memory portion, to cause read operations to fail on the first memory portion. In some embodiments, modifying the configuration settings corresponding to the first memory portion in accordance with the host instructions includes adjusting a write maximum pulse count for the first memory portion, to cause write operations to fail on the first memory portion. In some embodiments, modifying the configuration settings corresponding to the first memory portion in accordance with the host instructions includes adjusting an erase maximum pulse count for the first memory portion, to cause erase operations to fail on the first memory portion. In some embodiments, the failure notification comprises information describing failure to perform the first memory operation.

In some embodiments, the storage device comprises one or more three-dimensional (3D) memory devices and circuitry associated with operation of memory elements in the one or more 3D memory devices. In some embodiments, the circuitry and one or more memory elements in a respective 3D memory device, of the one or more 3D memory devices, are on the same substrate.

In some embodiments, the storage device comprises one or more flash memory devices. In some embodiments, the plurality of memory portions comprises non-volatile memory portions. In some embodiments, the plurality of memory portions comprises NAND flash memory portions.

In some embodiments, the storage device includes a plurality of controllers. In some embodiments, the plurality of controllers on the storage device include a storage controller and one or more flash controllers, the one or more flash controllers coupled by the storage controller to a host interface of the storage device.

In some embodiments, the plurality of controllers on the storage device include at least one non-volatile memory (NVM) controller and at least one other storage controller other than the at least one NVM controller.

In some embodiments, the storage device includes a dual in-line memory module (DIMM) device.

In some embodiments, one of the plurality of controllers on the storage device maps double data rate (DDR) interface commands to serial advance technology attachment (SATA) interface commands.

In another aspect, any of the methods described above are performed by a storage device that includes (1) an interface for coupling the storage device to a host system, (2) one or more memory devices, each with a plurality of memory portions, and (3) a storage controller, having one or more processors, the storage controller configured to: (A) receive host instructions from a host system to modify configuration settings corresponding to a first memory portion of the plurality of memory portions, and (B) in response to receiving the host instructions to modify the configuration settings: (a) identify the first memory portion from the host instructions and (b) modify the configuration settings corresponding to the first memory portion, in accordance with the host instructions, and (C) after said modifying the configuration settings corresponding to the first memory portion, send one or more commands to perform one or more memory operations having one or more physical addresses corresponding to the first memory portion, (D) receive a failure notification indicating failed performance of at least a first memory operation of the one or more memory operations, and (E) in response to receiving the failure notification: (a) execute one or more error recovery mechanisms.

In yet another aspect, any of the methods described above are performed by a storage device that includes means for coupling the storage device to a host system, memory means, including a plurality of memory portions, and controller means configured to perform any of the methods described herein.

In yet another aspect, any of the methods described above are performed by a storage system comprising (1) a storage medium (e.g., comprising one or more non-volatile storage devices, such as flash memory devices), (2) one or more processors, and (3) memory storing one or more programs, which when executed by the one or more processors cause the storage system to perform or control performance of any of the methods described herein.

In yet another aspect, a non-transitory computer readable storage medium stores one or more programs for execution by one or more processors of a storage device, the one or more programs including instructions for performing any one of the methods described above.

In some embodiments, the storage device includes a plurality of controllers, and the non-transitory computer readable storage medium includes a non-transitory computer readable storage medium for each controller of the plurality of controllers, each having one or more programs including instructions for performing any of the methods described above, or respective portions of any of the methods described above.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the embodiments described herein.

FIG. 1A is a block diagram illustrating a data storage system 100, in accordance with some embodiments. While some example features are illustrated, various other features have not been illustrated for the sake of brevity and so as not to obscure more pertinent aspects of the example embodiments disclosed herein. To that end, as a non-limiting example, data storage system 100 includes storage device 120, which includes host interface 122, storage device controller 128, one or more non-volatile memory (NVM) controllers 130 (e.g., NVM controller 130-1 through NVM controller 130-m), and non-volatile memory (NVM) (e.g., one or more NVM device(s) 140, 142 such as one or more flash memory devices), and is used in conjunction with computer system 110. Optionally, data storage system 100 also includes intermediate modules 125, as discussed below.

In this non-limiting example, data storage system 100 is used in conjunction with computer system 110. Computer system 110 is coupled to storage device 120 through data connections 101. However, in some embodiments computer system 110 includes storage device 120 as a component and/or sub-system. Computer system 110 may be any suitable computer device, such as a personal computer, a workstation, a computer server, or any other computing device. Computer system 110 is sometimes called a host or host system. In some embodiments, computer system 110 includes one or more processors, one or more types of memory, optionally includes a display and/or other user interface components such as a keyboard, a touch screen display, a mouse, a track-pad, a digital camera and/or any number of supplemental devices to add functionality. Further, in some embodiments, computer system 110 sends one or more host commands (e.g., read commands and/or write commands) on control line 111 to storage device 120. In some embodiments, computer system 110 is a server system, such as a server system in a data center, and does not have a display, keyboard, mouse or other user interface components.

In some embodiments, each NVM controller of NVM controllers 130 includes one or more processing units (sometimes called CPUs or processors or microprocessors or microcontrollers) configured to execute instructions in one or more programs (e.g., in NVM controllers 130). Further, in some embodiments, NVM controller 130 is a solid-state drive (SSD) controller. However, one or more other types of storage media may be included in accordance with aspects of a wide variety of implementations. In some embodiments, storage device 120 is or includes a dual in-line memory module (DIMM) device. In some embodiments, storage device 120 is compatible with a DIMM memory slot. For example, in some embodiments, storage device 120 is compatible with a 240-pin DIMM memory slot and is compatible with signaling in accordance with a DDR3 interface specification.

In some embodiments, storage device 120 includes a single NVM device (e.g., a single flash memory device) while in other embodiments storage device 120 includes a plurality of NVM devices (e.g., a plurality of flash memory devices). In some embodiments, NVM devices 140, 142 include NAND-type flash memory or NOR-type flash memory. NVM devices 140, 142 are coupled with NVM controllers 130 through connections that typically convey commands in addition to data, and, optionally, convey metadata, error correction information and/or other information in addition to data values to be stored in NVM devices 140, 142 and data values read from NVM devices 140, 142. For example, NVM devices 140, 142 can be configured for enterprise storage suitable for applications such as cloud computing, or for caching data stored (or to be stored) in secondary storage, such as hard disk drives. Additionally and/or alternatively, flash memory (e.g., NVM devices 140, 142) can also be configured for relatively smaller-scale applications such as personal flash drives or hard-disk replacements for personal, laptop and tablet computers. Although flash memory devices and flash controllers are used as an example here, in some embodiments storage device 120 includes other non-volatile memory device(s) and corresponding non-volatile storage controller(s). In some embodiments, storage device 120 includes one or more three-dimensional (3D) memory devices, as further defined herein.

In some embodiments, each NVM device 140 is divided into a number of addressable and individually selectable blocks. In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, each block includes a predefined number of pages, for example, 64 pages, 128 pages, 256 pages or another suitable number of pages. Blocks are typically grouped into a plurality of zones. Each block zone can be independently managed to some extent, which increases the degree of parallelism for parallel operations and simplifies management of each NVM device 140.

In some embodiments, storage device 120 includes intermediate modules 125, which include one or more processing units (also sometimes called CPUs or processors or microprocessors or microcontrollers) configured to execute instructions in one or more programs. Intermediate modules 125 are coupled to host interface 122 and storage device controller 128, in order to coordinate the operation of these components, including supervising and controlling functions such as one or more of: power up and power down, data hardening, charging energy storage device(s), data logging, communicating between modules on storage device 120, endurance management, RAID management, compression, error correction encoding/decoding, encryption, power failure recovery, wear leveling and/or other aspects of managing functions on storage device 120.

Storage device controller 128 is typically coupled with host interface 122, intermediate storage device modules 125, and NVM controllers 130. In some embodiments, during a write operation, storage device controller 128 receives data from computer system 110 through host interface 122 and during a read operation, storage device controller 128 sends data to computer system 110 through host interface 122. Further, host interface 122 provides additional data, signals, voltages, and/or other information needed for communication between storage device controller 128 and computer system 110. In some embodiments, storage device controller 128 and host interface 122 use a defined interface standard for communication, such as double data rate type three synchronous dynamic random access memory (DDR3). In some embodiments, storage device controller 128 and NVM controllers 130 use a defined interface standard for communication, such as serial advance technology attachment (SATA). In some other embodiments, the device interface used by storage device controller 128 to communicate with NVM controllers 130 is SAS (serial attached SCSI), or other storage interface. In some embodiments, storage device controller 128 maps DDR interface commands from the host system (e.g., computer system 110) to SATA or SAS interface commands for the plurality of controllers (e.g., storage device controller 128 and NVM controllers 130).

In some embodiments, storage device controller 128 includes one or more processing units (also sometimes called CPUs or processors or microprocessors or microcontrollers) configured to execute instructions in one or more programs (e.g., in storage device controller 128).

In some embodiments, storage device controller 128 receives host commands from computer system 110, via host interface 122, to perform one or more memory operations on one or more portions of non-volatile memory within storage device 120. For example, storage device controller 128 receives host commands to perform read, write, erase, read-modify-write or other memory programming operations.

In some embodiments, storage device controller 128 includes a management module 121 that translates the logical addresses in received host commands to physical addresses in the storage device 120, and then conveys memory commands (e.g., read, write or erase commands) corresponding to the received host commands to the respective NVM devices 140,142 via the respective NVM controllers 130 in accordance with the physical addresses. Typically, each NVM controller 130 resides on a distinct memory channel that has an assigned range of physical addresses that is distinct from the physical addresses assigned to the other memory channels.

In some embodiments, storage device controller 128 receives one or more host commands via host interface 122 to establish, modify or update configuration settings 182 optionally residing within storage device controller 128 (e.g., in management module 121), or configuration settings 150 optionally residing within one or more NVM controllers 130.

In some embodiments, configuration settings 182 and/or 150 include status flags to indicate if a respective memory portion is or is not in a failed state. For example, configuration settings 150-1 include a Boolean value for each memory block within NVM devices 140 connected to NVM controller 130-1, where a respective Boolean value indicates that the respective memory block has failed at performing one or more types of memory operations. In some embodiments, configuration settings 182 and/or 150 include status flags to indicate if a respective memory portion is or is not in a failed state for a particular type of memory operation. For example, configuration settings 150-1 include a Boolean value for each memory block within NVM devices 140 connected to NVM controller 130-1, where a respective Boolean value indicates that the respective memory block has failed at performing read operations. In some circumstances, these status flags allow for storage device controller 128 to return a memory operation failure notification to the host (e.g., computer system 110) after the host sends host instructions to perform one or more memory operations on a portion of non-volatile memory flagged to be in a failed state. Although the examples refer to configuration settings 182 and/or 150 including status flags with Boolean values, status flags may be of any data type. For example, a status flag may have one of several integer values to indicate the type of memory operation failure and a degree of failure.

In some embodiments, configuration settings 182, 150 correspond to memory operation performance properties for respective portions of non-volatile memory and respective memory operations. In some embodiments, memory operation performance properties include specific voltage thresholds to use for performing a read, write or erase operation. In some embodiments, memory operation performance properties include specific numbers of pulse counts for read, write or erase operations to perform. For example, configuration settings 182 stored in storage device controller 128 include specific configuration settings for NVM device 140-1, corresponding to an erase operation performance. In this example, the erase operation performance settings for NVM device 140-1 include a threshold voltage of 0.25 V for performing an erase operation on NVM device 140-1, and applying up to three voltage pulses when performing the erase operation. In this example, storage device controller 128 receives a host instruction to perform an erase operation on NVM device 140-1 (or a portion thereof), and starts by looking up erase operation performance properties for NVM device 140-1 in configuration settings 182. The erase operation is then performed with a threshold voltage of 0.25 V and three pulses before a failure to erase is detected. In some embodiments, this failure is sent back to the host (e.g., computer system 110) in the form of a failure notification, so the host can perform and observe an error recovery mechanism applied to NVM device 140-1.

In some embodiments, configuration settings 182 residing at storage device controller 128 include specific configuration settings for every portion of non-volatile memory within storage device 120 (e.g., for every NVM device 140, 142, or for every die, or every block among NVM devices 140, 142). In some embodiments, configuration settings 150 residing at a respective NVM controller 130 include specific configuration settings for every portion of non-volatile memory connected to NVM controller 130 (e.g., configuration settings 150-1 for NVM devices 140-1 to 140-n).

In some embodiments, algorithms, code or programming to enable memory failure simulation and error correction testing using modified configuration parameters, are loaded or updated by storage device controller 128. In some embodiments this loading or updating occurs during firmware initialization, during power up, during idle operation of the storage device or during normal operation of the storage device. In some implementations these host commands to modify configuration settings 182 or 150 are called "trim" commands or "configuration setting" commands, used to set internal or configuration parameters in the storage device controller 128 and/or the NVM controllers 130.

In some embodiments, rather than NVM controllers 130 and corresponding NVM devices 140, 142, storage device 120 includes one or more NVM modules in each of a plurality of memory channels, and each NVM module includes a processor (e.g., an ASIC) herein called an NVM module controller, and multiple NVM devices whose operation is at least controlled by the NVM module controller. In these embodiments, each NVM module includes memory, either volatile or non-volatile, for storing configuration settings such as configuration settings 150 described above, with respect to NVM controllers 130.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some embodiments, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1" and otherwise the raw data value is a "0."

Figure 1B:
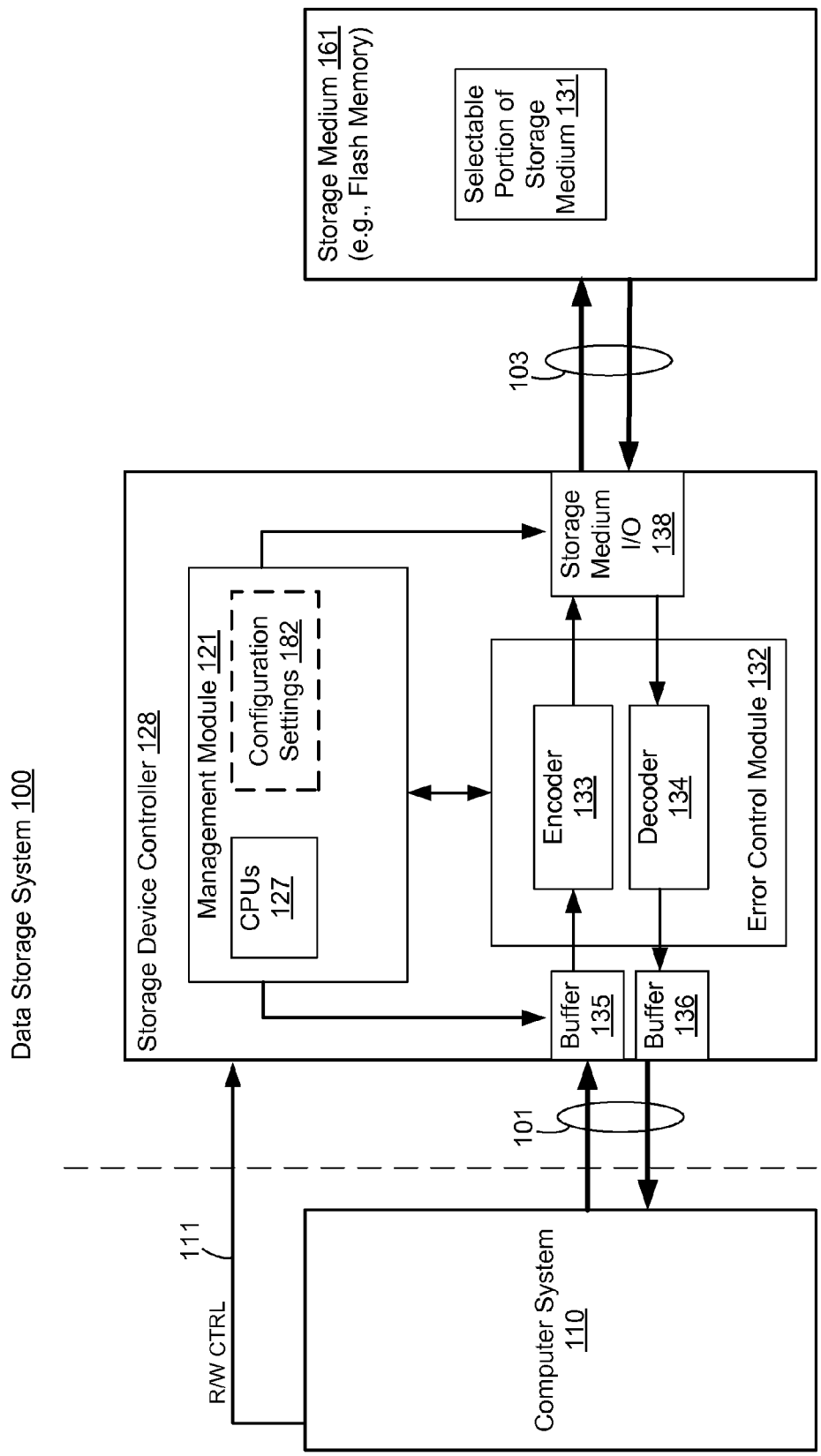
FIG. 1B is a block diagram of a data storage system, in accordance with some embodiments.

FIG. 1B illustrates a portion of data storage system 100, in accordance with some embodiments. While some example features are illustrated, various other features have not been illustrated for the sake of brevity and so as not to obscure more pertinent aspects of the example implementations disclosed herein. To that end, as a non-limiting example, the data storage system 100 includes a storage device controller 128, and a storage medium 161, and is used in conjunction with a computer system 110.

Features and functions of storage system 100, computer system 110 and storage device controller 128 already described above with reference to FIG. 1A are not repeated here.

Storage medium 161 is coupled to storage device controller 128 through connections 103. Connections 103 are sometimes called data connections, but typically convey commands in addition to data, and optionally convey metadata, error correction information and/or other information in addition to data values to be stored in storage medium 161 and data values read from storage medium 161. In some implementations, however, storage device controller 128 and storage medium 161 are included in the same device as components thereof. Additional features and functions of storage medium 161, including selectable portions such as selectable portion 131, are described above with respect to NVM devices 140, in the discussion of FIG. 1A. For example, storage medium 161 includes all of NVM devices 140, 142 from FIG. 1A.

In some implementations, storage device controller 128 includes a management module 121, an input buffer 135, an output buffer 136, an error control module 132 and a storage medium interface (I/O) 138. Storage device controller 128 may include various additional features that have not been illustrated for the sake of brevity and so as not to obscure more pertinent features of the example implementations disclosed herein, and a different arrangement of features may be possible. Input and output buffers 135,136 provide an interface to computer system 110 through data connections 101. Similarly, storage medium I/O 138 provides an interface to storage medium 161 though connections 103. In some implementations, storage medium I/O 138 includes read and write circuitry, including circuitry capable of conveying instructions to modify or update configuration parameters to storage medium 161.

In some implementations, management module 121 includes one or more processing units (CPUs, also sometimes called processors) 127 configured to execute instructions in one or more programs (e.g., in management module 121). In some implementations, the one or more CPUs 127 are shared by one or more components within, and in some cases, beyond the function of storage device controller 128. Management module 121 is coupled to input buffer 135, output buffer 136 (connection not shown), error control module 132 and storage medium I/O 138 in order to coordinate the operation of these components. In some embodiments, the management module 121 includes a set of configuration settings 182, as described earlier with respect to FIG. 1A.

Error control module 132 is coupled to storage medium I/O 138, input buffer 135 and output buffer 136. Error control module 132 is provided to limit the number of uncorrectable errors inadvertently introduced into data. In some embodiments, error control module 132 includes an encoder 133 and a decoder 134. Encoder 133 encodes data by applying an error control code to produce a codeword, which is subsequently stored in storage medium 161. In some embodiments, when the encoded data (e.g., one or more codewords) is read from storage medium 161, decoder 134 applies a decoding process to the encoded data to recover the data, and to correct errors in the recovered data within the error correcting capability of the error control code. If the decoding is successful, the decoded data is provided to output buffer 136, where the decoded data is made available to computer system 110. In some implementations, if the decoding is not successful, storage device controller 128 may resort to a number of remedial actions or provide an indication of an irresolvable error condition. For the sake of brevity, an exhaustive description of the various types of encoding and decoding algorithms generally available and known to those skilled in the art is not provided herein. In some implementations, management module 121 includes one or more procedures for modifying, establishing or updating configuration settings 182 as described above.

In some embodiments, management module 121 assists a host (e.g., computer system 110) in executing and testing error recovery mechanisms after the modification of one or more configuration settings of configuration settings 182 or 150, corresponding to a first memory portion. In some circumstances, after the modification of the one or more configuration settings, the host sends a host instruction to perform a memory operation on the first memory portion. In some circumstances, management module 121 determines the first memory portion from the received host instruction and looks up that memory portion's configuration settings. In some circumstances, configuration settings 182 or 150 store status flags to indicate if a respective memory portion is in a failed state. In these circumstances, management module 121 looks up the first memory portion's configuration settings (from either configuration settings 182 or configuration settings 150), and if that memory portion's configuration settings indicate that the first memory portion is in a failed state, storage device controller 128 receives a failure notification, and optionally sends the failure notification to the host.

In some circumstances, configuration settings 182 or 150 store memory performance operation properties, as described above. In some circumstances, management module 121 looks up the first memory portion's configuration settings from configuration settings 182, and determines how to perform the memory operation in the received host instruction (e.g., at what voltage to perform the operation, or how many attempts to make before the operation is deemed to have been a success or a failure). In these circumstances, management module 121 sends the host instruction to perform the memory operation at the first memory portion to storage medium I/O 138, along with the information regarding how to perform the memory operation, retrieved from configuration settings 182. In some circumstances, management module 121 sends the host instruction to perform the memory operation at the first memory portion to storage medium I/O 138, but the information regarding how to perform the memory operation at the first memory portion resides in configuration settings 150, and is retrieved therefrom. Regardless of whether configuration settings 182 or configuration settings 150 are used, if the memory operation in the received host instruction fails to be performed, storage device controller 128 sends a failure notification to the host.

Figure 2A:
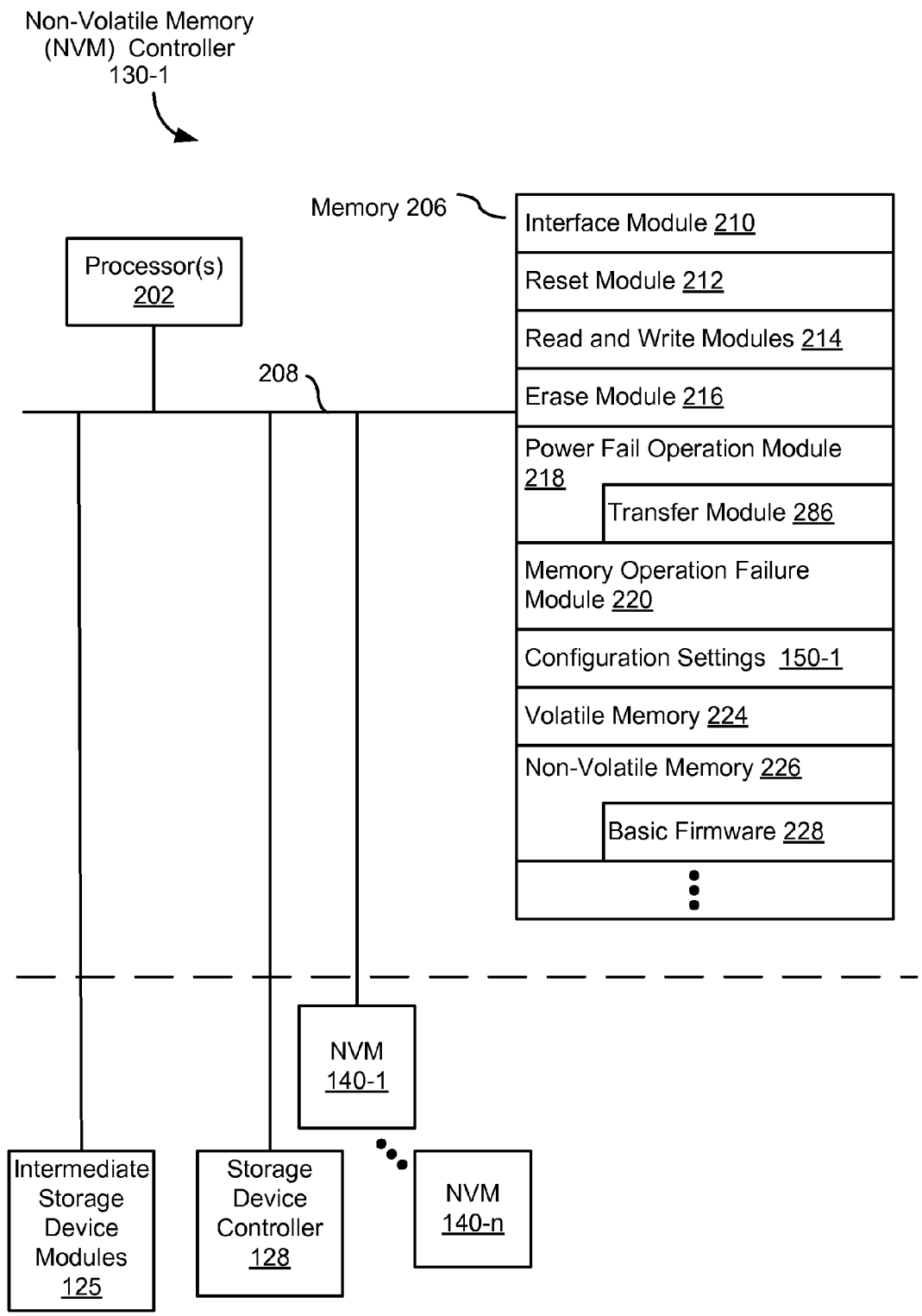
FIG. 2A is a block diagram illustrating a non-volatile memory (NVM) controller, in accordance with some embodiments.

FIG. 2A is a block diagram illustrating an implementation of an NVM controller 130-1, in accordance with some embodiments. NVM controller 130-1 typically includes one or more processors (also sometimes called CPUs or processing units or microprocessors or microcontrollers) 202 for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. In some embodiments, NVM controller 130-1 is coupled to storage device controller 128, intermediate storage device modules 125 (if present), and NVM devices 140 (e.g., NVM devices 140-1 through 140-*n*) by communication buses 208. Memory 206 includes high-speed random access memory, such as DRAM, SRAM, DDR RAM or other random access solid state memory devices, and may include NVM, such as one or more magnetic disk storage devices, optical disk storage devices, flash memory devices, or other non-volatile solid state storage devices. Memory 206 optionally includes one or more storage devices remotely located from processor(s) 202. Memory 206, or alternately the NVM device(s) within memory 206, comprises a non-transitory computer readable storage medium. In some embodiments, memory 206, or the computer readable storage medium of memory 206 stores the following programs, modules, and data structures, or a subset thereof:

- interface module 210 that is used for communicating with other components, such as storage device controller 128, intermediate storage device modules 125, and NVM devices 140;
- reset module 212 that is used for resetting NVM controller 130-1;
- one or more read and write modules 214 used for reading from and writing to NVM devices 140;
- erase module 216 that is used for erasing portions of memory on NVM devices 140;
- power failure module 218 that is used for detecting a power failure condition on the storage device (e.g., storage device 120, FIG. 1A) and triggering storage of data in volatile memory to NVM (e.g., any configuration parameters stored in volatile memory to NVM), optionally including:
  - transfer module 286 for transferring data held in volatile memory 224 to non-volatile memory;
- memory operation failure module 220 that is used for updating, establishing and/or maintaining configuration parameters 222 corresponding to NVM devices 140 or portions thereof;
- configuration settings 150-1 that store parameters related to simulating memory operation failures in one or more portions of NVM memory (e.g., in NVM device 140-1 or a die in storage medium 161 from FIG. 1B)
- volatile memory 224 including volatile data associated with NVM controller 130-1; and
- non-volatile memory 226 for storing data, optionally including:
  - basic firmware 228 that includes boot software to allow NVM controller 130-1 to boot firmware from a non-volatile firmware store.

In some embodiments, configuration settings 150-1 are flags to indicate memory failure status for one or more portions of NVM (e.g., a Boolean value that indicates NVM device 140-1 is or is not experiencing write operation failures). In some embodiments, configuration settings 150-1 include values that correspond to memory operation properties used to simulate memory operation failures in respective portions of NVM memory. For example, configuration settings 150-1 include a value that indicates a write operation performed on NVM device 140-2, should be performed at 0.25V. In this example, an attempt to write data to NVM device 140-2 results in a write operation failure, because a write voltage of at least 1V is required to successfully write data to NVM device 140-2.

Each of the above identified elements may be stored in one or more of the previously mentioned storage devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, include instructions for implementing respective operations in the methods described below with reference to FIGS. 3A-3B.

Although FIG. 2A shows NVM controller 130-1 in accordance with some embodiments, FIG. 2A is intended more as a functional description of the various features which may be present in an NVM controller than as a structural schematic of the embodiments described herein. In practice, and as recognized by those of ordinary skill in the art, items shown separately could be combined and some items could be separated. Further, although FIG. 2A shows NVM controller 130-1, the description of FIG. 2A similarly applies to other NVM controllers (e.g., NVM module 130-*m*) in storage device 120 (FIG. 1A).

Figure 2B:
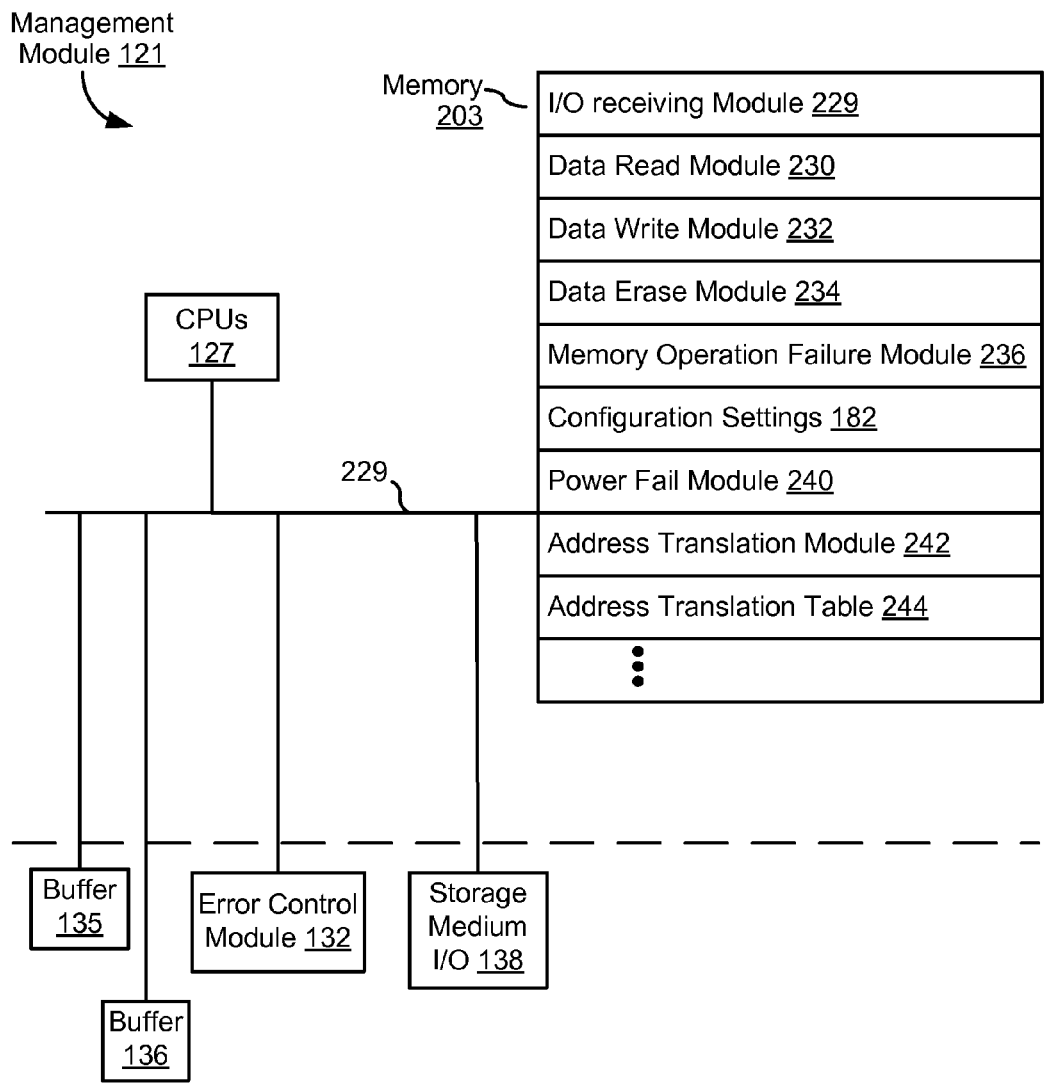
FIG. 2B is a block diagram illustrating a management module of a storage device controller, in accordance with some embodiments.

FIG. 2B is a block diagram illustrating an exemplary management module 121 in accordance with some embodiments. Management module 121 typically includes: one or more processing units (CPUs) 127 for executing modules, programs and/or instructions stored in memory 203 and thereby performing processing operations; memory 203; and one or more communication buses 229 for interconnecting these components. One or more communication buses 229, optionally, include circuitry (sometimes called a chipset) that interconnects and controls communications between system components. Management module 121 is coupled to buffer 135, buffer 136, error control module 132, and storage medium I/O 138 by one or more communication buses 229. Memory 203 includes high-speed random access memory, such as DRAM, SRAM, DDR RAM or other random access solid state memory devices, and may include non-volatile memory, such as one or more flash memory devices, other non-volatile solid state storage devices, magnetic disk storage devices, or optical disk storage devices. Memory 203 optionally includes one or more storage devices shared with one or more NVM controllers 130 in storage medium 161. Memory 203, or alternatively the non-volatile memory device(s) within memory 203, comprises a non-transitory computer readable storage medium. In some embodiments, memory 203, or the non-transitory computer readable storage medium of memory 202, stores the following programs, modules, and data structures, or a subset or superset thereof:

- I/O receiving module 229 that is used for receiving from a host a plurality of input/output (I/O) requests (e.g., read requests and/or write requests), including requests to modify or establish one or more configuration settings 182;
- data read module 230 for reading data from storage medium 161 (FIG. 1B) comprising flash memory (e.g., one or more flash memory devices, such as NVM devices 140, 142, each comprising a plurality of die);
- data write module 232 for writing data to storage medium 161;
- data erase module 234 for erasing data from storage medium 161;
- memory operation failure module 236 used for updating, establishing and/or maintaining configuration parameters 182 corresponding to respective portions of memory on storage medium 161;
- configuration settings 182, described above as configuration settings 150-1 (FIG. 2A);
- power fail module 240 used for detecting a power failure condition on the storage device (e.g., storage device 120, FIG. 1A) and triggering storage of data in volatile memory to non-volatile memory, and optionally working with power fail modules in NVM controllers 130;
- address translation module 242, for translating logical addresses specified in received host commands to physical addresses in storage medium 161, and thereby identifying the memory channel and/or NVM controller 130, and/or NVM device 140 to which respective memory commands are to be directed; and
- address translation table(s) 244.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 203 may store a subset of the modules and data structures identified above. Furthermore, memory 203 may store additional modules and data structures not described above. In some embodiments, the programs, modules, and data structures stored in memory 203, or the non-transitory computer readable storage medium of memory 203, provide instructions for implementing any of the methods described below with reference to FIGS. 3A-3B.

Although FIG. 2B shows a management module 121, FIG. 2B is intended more as functional description of the various features which may be present in a management module than as a structural schematic of the embodiments described herein. In practice, and as recognized by those of ordinary skill in the art, the programs, modules, and data structures shown separately could be combined and some programs, modules, and data structures could be separated.

Figure 3A:
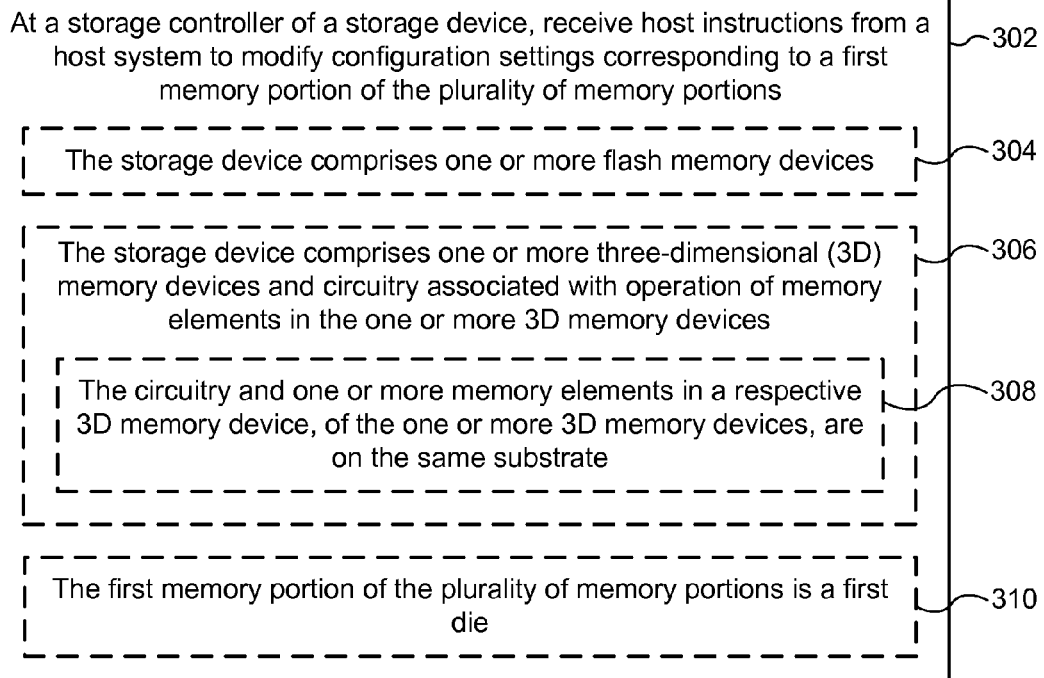
FIGS. 3A-3B illustrate a flowchart representation of a memory operation failure simulation method, in accordance with some embodiments.
Figure 3A:
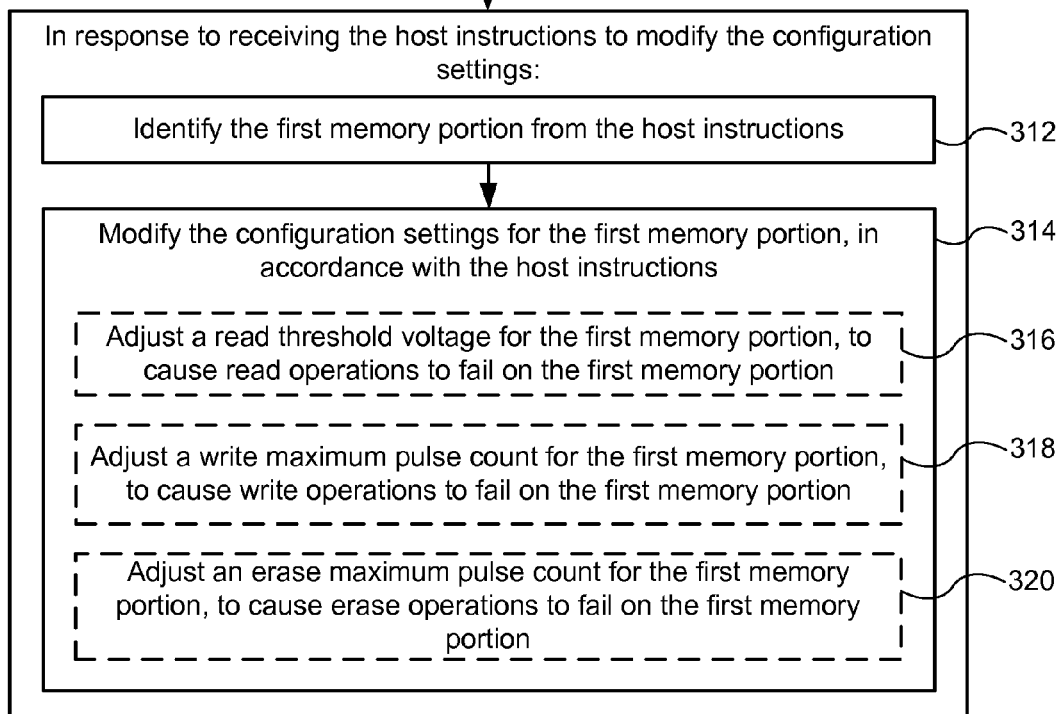
Figure 3A:
Figure 3B:
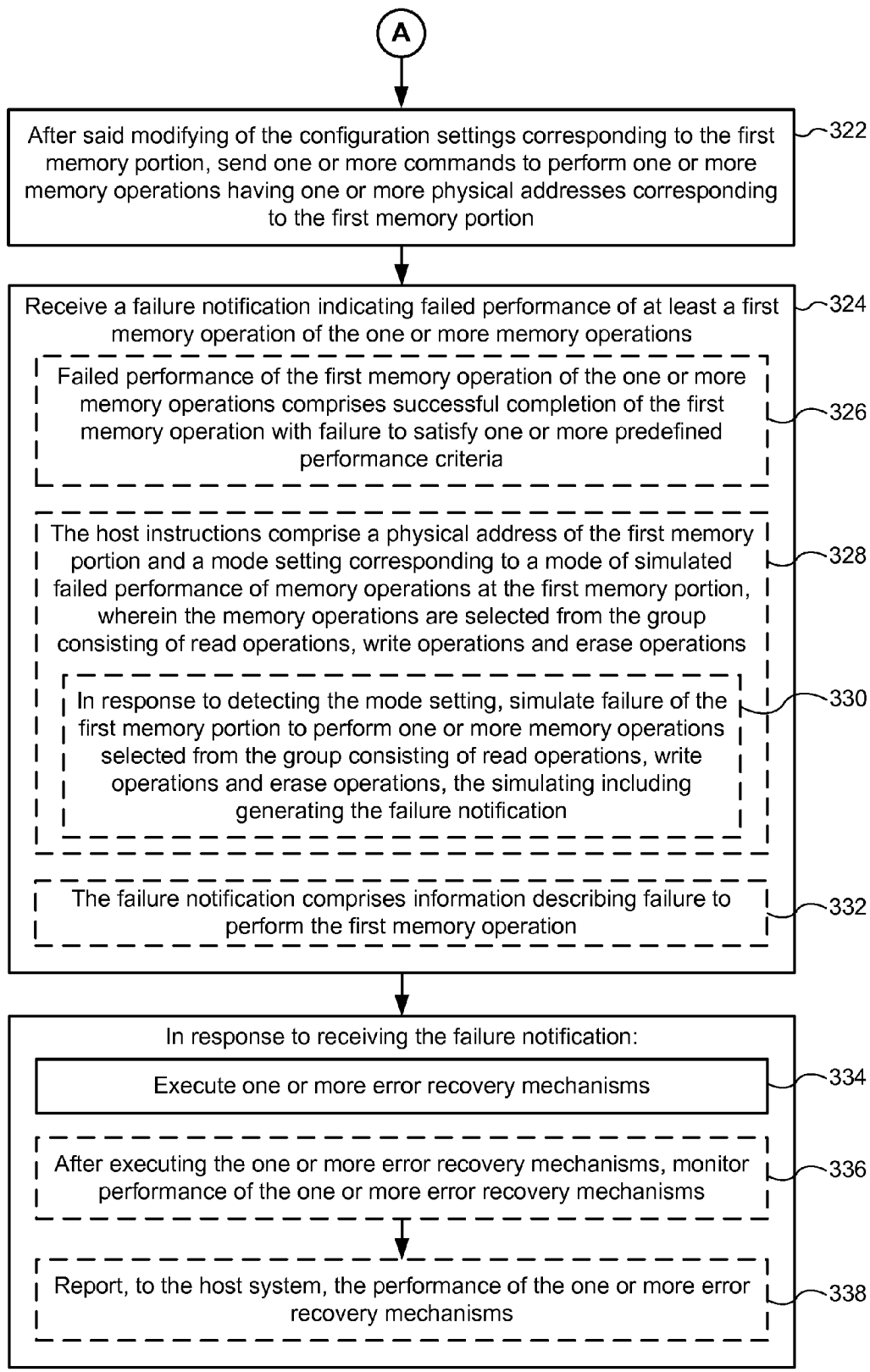

FIGS. 3A-3B illustrate a flowchart representation of a memory operation failure simulation method 300, in accordance with some embodiments. At least in some embodiments, method 300 is performed by a storage device (e.g., storage device 120, FIG. 1A) or one or more components of the storage device (e.g., storage controller 128 and/or storage medium 161, FIG. 1B), wherein the storage device is operatively coupled with a host system (e.g., computer system 110, FIGS. 1A and 1B). In some embodiments, method 300 is governed by instructions that are stored in a non-transitory computer readable storage medium and that are executed by one or more processors of a device, such as the one or more processing units (CPUs) 127 of management module 121, shown in FIGS. 1B and 2B. In some embodiments, method 300 is performed by a storage system (e.g., data storage system 100, FIGS. 1A and 1B) or one or more components of the storage system (e.g., computer system 110 and/or storage device 120, FIG. 1A). In some embodiments, some of the operations of method 300 are performed at a host (e.g., computer system 110, FIG. 1A) and information is transmitted to a storage device (e.g., storage device 120, FIG. 1A). In some embodiments, method 300 is governed, at least in part, by instructions that are stored in a non-transitory computer readable storage medium and that are executed by one or more processors of a host. For ease of explanation, the following describes method 300 as performed by a storage controller (e.g., storage device controller 128, FIG. 1B). However, those skilled in the art will appreciate that in other embodiments, one or more of the operations described in method 300 are performed by a host (e.g., computer system 110, FIG. 1A), or by another controller within the storage device (e.g., NVM controller 130, FIGS. 1A and 2A).

The method includes, at a storage controller of a storage device that comprises one or more memory devices, each with a plurality of memory portions, receiving (302) host instructions from a host system to modify configuration settings corresponding to a first memory portion of the plurality of memory portions. In some embodiments, every memory portion of the plurality of memory portions is a non-volatile memory portion, and in some embodiments, every memory portion of the plurality of memory portions is a NAND flash memory portion.

In some embodiments, the storage device includes (304) one or more flash memory devices. In some embodiments, the storage device includes a storage medium (e.g., storage medium 161, FIG. 1B), and the storage medium comprises one or more non-volatile storage devices, such as flash memory devices. In some embodiments, the storage medium (e.g., storage medium 161, FIG. 1B) is a single flash memory device, while in other embodiments the storage medium includes a plurality of flash memory devices. For example, in some implementations, the storage medium includes dozens or hundreds of flash memory devices, organized in parallel memory channels, such as 16, 32 or 64 flash memory devices per memory channel, and 8, 16 or 32 parallel memory channels. In some embodiments, the non-volatile storage medium (e.g., storage medium 161, FIG. 1B) includes NAND-type flash memory or NOR-type flash memory. In other embodiments, the storage medium comprises one or more other types of non-volatile storage devices.

In some embodiments, the storage device comprises (306) one or more three-dimensional (3D) memory devices, as further defined herein, and circuitry associated with operation of memory elements in the one or more 3D memory devices. In some embodiments, the storage device comprises a storage medium (e.g., storage medium 161, FIG. 1B), and the storage medium comprises one or more 3D memory devices and circuitry associated with operation of memory elements in the one or more 3D memory devices. In some embodiments, the storage medium (e.g., storage medium 161, FIG. 1B) is a single 3D memory device, while in other embodiments the storage medium includes a plurality of 3D memory devices.

In some embodiments, the circuitry and one or more memory elements in a respective 3D memory device, of the one or more 3D memory devices, are (308) on the same substrate (e.g., a silicon substrate). In some embodiments, the substrate is a wafer on which the material layers of the one or more memory elements are deposited and/or in which the one or more memory elements are formed. In some embodiments, the substrate is a carrier substrate which is attached to the one or more memory elements after they are formed. As a non-limiting example, in some embodiments, the substrate includes a semiconductor such as silicon.

In some embodiments, the first memory portion (310) of the plurality of memory portions is a first die. In some embodiments, the host instructions are tied to a specific die using a physical address. In some embodiments, the configuration settings modified by the host instructions are stored in DRAM in the storage controller. In some embodiments, the host instructions are received through a protocol such as SATA, SAS, DDR or DDR3.

The method includes, in response to receiving the host instructions to modify the configuration settings, identifying (312) the first memory portion from the host instructions, and modifying (314) the configuration settings corresponding to the first memory portion, in accordance with the host instructions. For example, the host instructions include a logical address for the first memory portion that the storage controller uses in conjunction with a logical-to-physical address table (e.g., address translation table 244, FIG. 2B), to identify the first memory portion among a plurality of memory portions. In this same example, the storage controller determines from the host instructions that a write operation parameter for the first memory portion must be changed. Therefore, the write operation performance properties for the first memory portion are modified in accordance with the host instructions, such that future write operations on the first memory portion are performed at a voltage of 1 V, for a maximum of four pulse counts before the write operation is deemed to have failed or succeeded.

In some embodiments, or in some circumstances, modifying (314) the configuration settings corresponding to the first memory portion, in accordance with the host instructions includes changing the value of a status flag corresponding to the first memory portion, to indicate that the first memory portion is or is not in a failed state. For example, a Boolean flag corresponding to a particular die in the storage device is modified to indicate that the particular die cannot perform any type of memory operation (e.g., at least read, write and erase), or it cannot perform memory operations of a specific type (e.g., read).

In some embodiments, modifying (314) the configuration settings corresponding to the first memory portion includes adjusting (316) a read threshold voltage for the first memory portion, to cause read operations to fail on the first memory portion. For example, the read threshold voltage for a particular die among the plurality of memory portions, is set to 0.5 V, which is too low to perform an adequate read operation on the particular die. In this example, a read operation performed on the particular die after making the adjustment to the read voltage, fails. In some embodiments, modifying (314) the configuration settings includes adjusting a write threshold voltage for the first memory portion, to cause write operations to fail on the first memory portion, or adjusting an erase threshold voltage for the first memory portion, to cause erase operations to fail on the first memory portion.

In some embodiments, modifying (314) the configuration settings includes adjusting (318) a write maximum pulse count for the first memory portion, to cause write operations to fail on the first memory portion. For example, the write maximum pulse count for a particular memory block is set to a value of one, indicating that no more than one write operation pulse can be performed on the particular memory block. In this example, a write operation is attempted on the particular memory block after making the adjustment to the write maximum pulse count, and fails after the first write operation pulse is applied. In this example, since the write maximum pulse count for the particular memory block is set to one, this is considered to be a failed memory operation, and a failure notification is sent to the host system (e.g., computer system 110, FIG. 1A, 1B).

In some embodiments, modifying (314) the configuration settings includes adjusting (320) an erase maximum pulse count for the first memory portion, to cause erase operations to fail on the first memory portion. In some embodiments, modifying (314) the configuration settings includes adjusting a read maximum pulse count for the first memory portion, to cause read operations to fail on the first memory portion. In some embodiments, modifying (314) the configuration settings includes adjusting both a threshold voltage and a maximum pulse count for a respective memory operation on a respective portion of non-volatile memory, to cause the respective memory operation to fail on the respective portion of non-volatile memory.

The method includes, after said modifying of the configuration settings corresponding to the first memory portion, sending (322) one or more commands to perform one or more memory operations having one or more physical addresses corresponding to the first memory portion. For example, after modifying the configuration settings (e.g., configuration settings 150-1 at NVM controller 130-1) corresponding to a particular die, a Boolean status flag for the particular die is set to indicate a failed state. The storage controller then sends a command to perform a read operation on the particular die. In some embodiments, the one or more commands to perform one or more memory operations are received from a host (e.g., computer system 110, FIG. 1A, 1B). In some embodiments, the one or more commands to perform one or more memory operations are initiated by the storage controller (e.g., storage device controller 128 or management module 121, FIG. 1B).

The method includes, receiving (324) a failure notification (i.e., from the non-volatile memory) indicating failed performance of at least a first memory operation of the one or more memory operations. In some embodiments, the storage controller sends this failure notification to the host. In some embodiments, failed performance of the first memory operation of the one or more memory operations comprises (326) successful completion of the first memory operation with failure to satisfy one or more predefined performance criteria. For example, a read operation is successfully performed on NVM device 140-1 (FIG. 1A), but only at a voltage of 2 V, while the predefined performance criteria for NVM device 140-1 requires the read operation to be performed at 1.8 V or less.

In some embodiments, the host instructions comprise (328) a physical address of the first memory portion and a mode setting corresponding to a mode of simulated failed performance (e.g., a host instruction to toggle a status flag indicating a failed state) of memory operations at the first memory portion, wherein the memory operations are selected from the group consisting of read operations, write operations and erase operations. In some embodiments, the method includes, in response to detecting the mode setting, simulating (330) failure of the first memory portion to perform one or more memory operations selected from the group consisting of read operations, write operations and erase operations, the simulating including generating the failure notification. In some embodiments, the failure notification comprises (332) information describing failure to perform the first memory operation. For example, the failure notification indicates the type of memory operation attempted, the voltage (or final voltage) that the memory operation was attempted at, the number of attempts performed and the logical or physical address of the first memory portion.

In some embodiments, the failure notification provides information about compromised performance of the attempted memory operation. In some circumstances, compromised performance of a memory operation means that the memory operation completed, but failed to satisfy one or more performance criteria, while in some circumstances, compromised performance is indicative of imminent failure of the first memory portion.

The method includes, in response to receiving the failure notification, executing (334) one or more error recovery mechanisms. For example, an error recovery mechanism backs up the data from the first memory portion to another portion of non-volatile memory. In some embodiments, the method includes, after executing the one or more error recovery mechanisms, monitoring (336) performance of the one or more error recovery mechanisms. In some embodiments, the method includes reporting (338), to the host system, the performance of the one or more error recovery mechanisms.

In some embodiments, any of the methods described above are performed by a storage device, the storage device including (1) one or more processors, and (2) memory storing one or more programs, which when executed by the one or more processors cause the storage device to perform or control performance of any of the methods described herein.

In some embodiments, any of the methods described above are performed by a storage system comprising (1) a storage medium (e.g., comprising one or more non-volatile storage devices, such as flash memory devices) (2) one or more processors, and (3) memory storing one or more programs, which when executed by the one or more processors cause the storage system to perform or control performance of any of the methods described herein.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible (e.g., a NOR memory array). NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The term "three-dimensional memory device" (or 3D memory device) is herein defined to mean a memory device having multiple memory layers or multiple levels (e.g., sometimes called multiple memory device levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

One of skill in the art will recognize that this invention is not limited to the two dimensional and three dimensional exemplary structures described but cover all relevant memory structures within the spirit and scope of the invention as described herein and as understood by one of skill in the art.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of operation in a storage device that comprises a storage controller and one or more memory devices, each with a plurality of memory portions, comprising:
   at the storage controller:
      receiving host instructions from a host system to modify configuration settings specifically corresponding to a first memory portion of the plurality of memory portions;
      in response to receiving the host instructions to modify the configuration settings:
         identifying the first memory portion from the host instructions; and
         modifying the configuration settings specifically corresponding to the first memory portion, in accordance with the host instructions;
      after said modifying of the configuration settings specifically corresponding to the first memory portion, sending one or more commands to perform one or more memory operations having one or more physical addresses corresponding to the first memory portion;

receiving a failure notification indicating failed performance of at least a first memory operation of the one or more memory operations; and in response to receiving the failure notification:
executing one or more error recovery mechanisms.

2. The method of claim 1, further comprising, in response to receiving the failure notification:

after executing the one or more error recovery mechanisms, monitoring performance of the one or more error recovery mechanisms; and reporting, to the host system, the performance of the one or more error recovery mechanisms.

3. The method of claim 1, wherein the first memory portion of the plurality of memory portions comprises a first die.

4. The method of claim 1, wherein failed performance of the first memory operation of the one or more memory operations comprises successful completion of the first memory operation with failure to satisfy one or more predefined performance criteria.

5. The method of claim 1, wherein the host instructions comprise a physical address of the first memory portion and a mode setting corresponding to a mode of simulated failed performance of memory operations at the first memory portion, wherein the memory operations are selected from the group consisting of read operations, write operations and erase operations.

6. The method of claim 5, further including, in response to detecting the mode setting, simulating failure of the first memory portion to perform one or more memory operations selected from the group consisting of read operations, write operations and erase operations, the simulating including generating the failure notification.

7. The method of claim 1, wherein modifying the configuration settings specifically corresponding to the first memory portion, in accordance with the host instructions includes adjusting a read threshold voltage for the first memory portion, to cause read operations to fail on the first memory portion.

8. The method of claim 1, wherein modifying the configuration settings specifically corresponding to the first memory portion, in accordance with the host instructions includes adjusting a write maximum pulse count for the first memory portion, to cause write operations to fail on the first memory portion.

9. The method of claim 1, wherein modifying the configuration settings specifically corresponding to the first memory portion, in accordance with the host instructions includes adjusting an erase maximum pulse count for the first memory portion, to cause erase operations to fail on the first memory portion.

10. The method of claim 1, wherein the failure notification comprises information describing failure to perform the first memory operation.

11. A storage device, comprising:

an interface for coupling the storage device to a host system;

one or more memory devices, each with a plurality of memory portions; and a storage controller, having one or more processors, the storage controller configured to:

receive host instructions from a host system to modify configuration settings specifically corresponding to a first memory portion of the plurality of memory portions;

in response to receiving the host instructions to modify the configuration settings:

identify the first memory portion from the host instructions; and modify the configuration settings specifically corresponding to the first memory portion, in accordance with the host instructions;

after said modifying of the configuration settings specifically corresponding to the first memory portion, send one or more commands to perform one or more memory operations having one or more physical addresses corresponding to the first memory portion;

receive a failure notification indicating failed performance of at least a first memory operation of the one or more memory operations; and in response to receiving the failure notification:
execute one or more error recovery mechanisms.

12. The storage device of claim 11, the storage controller further configured to, in response to receiving the failure notification:

after executing the one or more error recovery mechanisms, monitor performance of the one or more error recovery mechanisms; and report, to the host system, the performance of the one or more error recovery mechanisms.

13. The storage device of claim 11, wherein failed performance of the first memory operation of the one or more memory operations comprises successful completion of the first memory operation with failure to satisfy one or more predefined performance criteria.

14. The storage device of claim 11, wherein the host instructions comprise a physical address of the first memory portion and a mode setting corresponding to a mode of simulated failed performance of memory operations at the first memory portion, wherein the memory operations are selected from the group consisting of read operations, write operations and erase operations.

15. The storage device of claim 11, wherein modifying the configuration settings specifically corresponding to the first memory portion, in accordance with the host instructions includes adjusting a read threshold voltage for the first memory portion, to cause read operations to fail on the first memory portion.

16. The storage device of claim 11, wherein modifying the configuration settings specifically corresponding to the first memory portion, in accordance with the host instructions includes adjusting a write maximum pulse count for the first memory portion, to cause write operations to fail on the first memory portion.

17. The storage device of claim 11, wherein modifying the configuration settings specifically corresponding to the first memory portion, in accordance with the host instructions includes adjusting an erase maximum pulse count for the first memory portion, to cause erase operations to fail on the first memory portion.

18. A non-transitory computer-readable storage medium, storing one or more programs for execution by one or more processors of a storage device, the one or more programs including instructions for:

receiving host instructions from a host system to modify configuration settings specifically corresponding to a first memory portion of the plurality of memory portions;

in response to receiving the host instructions to modify the configuration settings:
  identifying the first memory portion from the host instructions; and
  modifying the configuration settings specifically corresponding to the first memory portion, in accordance with the host instructions;
after said modifying of the configuration settings specifically corresponding to the first memory portion, sending one or more commands to perform one or more memory operations having one or more physical addresses corresponding to the first memory portion;
receiving a failure notification indicating failed performance of at least a first memory operation of the one or more memory operations; and
in response to receiving the failure notification:
  executing one or more error recovery mechanisms.

19. The storage medium of claim 18, the one or more programs further including instructions for, in response to receiving the failure notification:
  after executing the one or more error recovery mechanisms, monitoring performance of the one or more error recovery mechanisms; and
  reporting, to the host system, the performance of the one or more error recovery mechanisms.

20. The storage medium of claim 18, wherein failed performance of the first memory operation of the one or more memory operations comprises successful completion of the first memory operation with failure to satisfy one or more predefined performance criteria.

21. The storage medium of claim 18, wherein the host instructions comprise a physical address of the first memory portion and a mode setting corresponding to a mode of simulated failed performance of memory operations at the first memory portion, wherein the memory operations are selected from the group consisting of read operations, write operations and erase operations.

22. The storage medium of claim 18, wherein modifying the configuration settings specifically corresponding to the first memory portion, in accordance with the host instructions includes adjusting a read threshold voltage for the first memory portion, to cause read operations to fail on the first memory portion.

23. The storage medium of claim 18, wherein modifying the configuration settings specifically corresponding to the first memory portion, in accordance with the host instructions includes adjusting a write maximum pulse count for the first memory portion, to cause write operations to fail on the first memory portion.

24. The storage medium of claim 18, wherein modifying the configuration settings specifically corresponding to the first memory portion, in accordance with the host instructions includes adjusting an erase maximum pulse count for the first memory portion, to cause erase operations to fail on the first memory portion.

* * * * *